(12) United States Patent
Tompa

(10) Patent No.: US 6,289,842 B1
(45) Date of Patent: Sep. 18, 2001

(54) PLASMA ENHANCED CHEMICAL VAPOR DEPOSITION SYSTEM

(75) Inventor: Gary Steven Tompa, Somerville, NJ (US)

(73) Assignee: Structured Materials Industries Inc., Piscataway, NJ (US)

( * ) Notice: Subject to any disclaimer, the term of this patent is extended or adjusted under 35 U.S.C. 154(b) by 0 days.

(21) Appl. No.: 09/335,662

(22) Filed: Jun. 18, 1999

Related U.S. Application Data

(60) Provisional application No. 60/090,161, filed on Jun. 22, 1998.

(51) Int. Cl.$^7$ ................ C23C 16/00; C23F 1/02
(52) U.S. Cl. ............. 118/723 E; 156/345; 118/723 R; 118/715
(58) Field of Search .............. 118/723 E, 723 ER, 118/723 I, 723 IR, 723 R, 715; 156/345; 204/298.07, 298.33

(56) References Cited

U.S. PATENT DOCUMENTS

| | | |
|---|---|---|
| 3,854,443 | 12/1974 | Baerg . |
| 4,997,677 | 3/1991 | Wang et al. . |
| 5,246,529 * | 9/1993 | Fukasawa et al. ............ 156/643 |
| 5,273,588 | 12/1993 | Foster et al. . |
| 5,342,652 | 8/1994 | Foster et al. . |
| 5,348,587 | 9/1994 | Eichman et al. . |
| 5,422,139 | 6/1995 | Fischer . |
| 5,423,936 * | 6/1995 | Tomita et al. ............ 156/345 |
| 5,434,110 | 7/1995 | Foster et al. . |
| 5,567,243 | 10/1996 | Foster et al. . |
| 5,595,606 | 1/1997 | Fujikawa et al. . |
| 5,610,106 | 3/1997 | Foster et al. . |
| 5,628,829 | 5/1997 | Foster et al. . |
| 5,647,945 * | 7/1997 | Matsuse et al. ............ 156/345 |
| 5,716,501 | 2/1998 | Kawashima et al. . |
| 5,759,281 | 7/1998 | Gurary et al. . |
| 6,035,803 * | 3/2000 | Robles et al. ............ 118/723 E |

* cited by examiner

Primary Examiner—Gregory Mills
Assistant Examiner—Luz L. Alejandro
(74) Attorney, Agent, or Firm—William L Botjer

(57) ABSTRACT

A Metal Organic Chemical Vapor Deposition (MOCVD) system particularly suitable for use at low deposition pressures and high or low temperatures. The system includes a reactor chamber having a reactant gas distribution unit (showerhead) which may be height adjustable having a temperature control chamber, for controlling the temperature of the reactants, a chamber for providing a uniform flow of carrier gas and a gas distribution chamber which includes baffling which can preclude gas phase mixing of the reactants. The gas distribution unit also includes an integral plasma generating electrode system for providing plasma enhanced deposition with controlled distribution of reactants. Also located in the reactor chamber is a temperature control unit for heating and/or cooling the wafers and a non-levitating rotating wafer carrier.

16 Claims, 3 Drawing Sheets

PLASMA ENHANCED CHEMICAL VAPOR DEPOSITION SYSTEM

CROSS REFERENCE TO RELATED APPLICATIONS

This application claims priority of U.S. provisional application Ser. No. 60/090,161 filed Jun. 2, 1998.

STATEMENT OF GOVERNMENT SUPPORT OF THE INVENTION

The work resulting in this invention was supported by the Ballistic Missile Defense Organization of the Department of Defense under BMDO/ONR (Contract No.:N00014-95-C-0234), and BMDO/AF-Rome Laboratories (Contract No.: F19628-96-C-0024) and follow-on contract No. F19628-99-C-006.

BACKGROUND AND SUMMARY OF THE INVENTION

This application is directed to a fully integrated oxide Metal Organic Chemical Vapor Deposition (MOCVD) system having a plasma enhanced CVD showerhead.

Chemical Vapor Deposition (CVD) systems and Metal Organic Chemical Vapor Deposition (MOCVD) systems are widely used to manufacture electronic devices, such as integrated circuits by the sequential or simultaneous deposition of compounds upon a heated substrate, which is usually in the form of a wafer. The MOCVD growth mechanism proceeds by the decomposition of organometallic and/or metal hydride or other reactants at typically a heated surface of the substrate on which they are to be deposited. Equivalently, a relatively cool surface could be used to condense gas phase vapors. The reactants are transported to the surface in the gas phase by typically one or more carrier gases. The metals deposit on the surface, forming the desired compound and the undesirable by-products are pumped away in a gaseous form. Ideally, the reactants have vapor pressures of several torr and are liquids, e.g. TMAI or TMGa, or gases, e.g. $SiH_4$, $GeH_4$, $CH_4$, $WF_6$, $A5H35:H9$, . . . ) so that they may be easily transported to the reactor. However this is not true in all cases, for instance, Ba, Sr, Y, Cu, Er, Eu, and several other elements, which are needed for ferroelectrics, dielectrics, superconductors, luminescent and other films require high source temperatures and usually benefit from the use of a flash evaporator.

Silicon Carbide (SiC) based electronic devices are a rapidly developing technology and market. Key to these devices are production of high quality films and substrates. Recent work has indicated that a system capable of "accepted" deposition temperatures (through 1600° C. for epitaxy) and super high deposition temperatures (1800–2300° C. for substrate formation) should in combination produce superior device films. Superhigh temperature deposition capability greatly impacts all system operating parameters and components. Such items include: substrate heating, wafer holder construction, prevention of wafer levitation in an RF system, prevention of arcing in a high power RF system, reactor construction and cooling, gas and reactant inlets, flow manipulation, wafer rotation, materials of construction, minimization of etching, and physical layout of materials, among others. The present system is capable of depositing device films through the full temperature range (up to 2300° C.). The non-levitating wafer system assembly, heatable through 2300° C. without arcing or other failures is also compatible with in-situ plasma cleaning or plasma assisted deposition).

Another form of CVD deposition is where a substrate is cooled to condense a preactivated (by heat or plasma by example) material or an evaporated material. A prime example is parylene, which is evaporated at a low temperature(~150° C.), "cracked" at a high temperature (~680° C.) and then subsequently deposited on a cooled substrate (~room temperature to −50° C.). Such deposition techniques are compatible with the equipment described herein.

It is an object of the present invention to provide an improved Metal Organic Chemical Vapor Deposition System.

It is an object of the present invention to provide an improved Metal Organic Chemical Vapor Deposition System suitable for use at low deposition pressures (<0.1 to >100 Torr) and from low (<−50° C.) to high temperatures (up to 2300°).

It is an another object of the present invention to provide an improved Metal Organic Chemical Vapor Deposition System that is capable of depositing a wide variety of compounds and elements.

It is an object of the present invention to provide an improved Metal Organic Chemical Vapor Deposition System that employs a gas distribution unit that produces a uniform flow of carrier gas and reactants delivered to the reactor separately.

It is an object of the present invention to provide an improved Metal Organic Chemical Vapor Deposition System that has temperature control of the carrier and reactant gases at the gas distribution unit.

It is an object of the present invention to provide an improved Metal Organic Chemical Vapor Deposition System that can preclude (or facilitate) gas phase mixing of the reactants.

It is an object of the present invention to provide an improved Metal Organic Chemical Vapor Deposition System that includes an integral plasma generating unit that provides a plasma located in close distant, intermediate, or close proximity to the deposition surface.

It is an object of the present invention to provide an improved Metal Organic Chemical Vapor Deposition System that includes a rotating heating wafer holder that prevents wafer levitation during rotation when heated by high power RF.

It is an object of the present invention to provide an improved Metal Organic Chemical Vapor Deposition System that includes a rotating wafer holder that can be chilled or heated (resistively or by RF).

The present invention is directed to a Metal Organic Chemical Vapor Deposition (MOCVD) system particularly suitable for use at low deposition pressures and high or low temperatures. The system includes a reactor chamber that is isolated from the atmosphere and which can also be thermally isolated from the surrounding conditions. Located within the reactor chamber is a reactant gas distribution unit (showerhead) having a temperature control chamber, for controlling the temperature of the reactants, a chamber for providing a uniform flow of carrier gas and a gas distribution chamber which includes baffling which can preclude (or facilitate) gas phase mixing of the reactants. The gas distribution unit also includes an integral plasma generating electrode system for providing plasma enhanced deposition. Also located in the reactor chamber are either a RF wafer heating unit and a non-levitating rotating wafer carrier, a resistive heating element or a wafer heating and cooling assembly.

The present invention is capable of depositing a wide array of compounds and elements, including: phosphorous films (such as $ZnSi_xO_y$, $ZnGe_xO_y$, $ZnIn_xO_y$, $ZnGa_xO_y$, ...), dielectric films (such as $BaSr_xTi_{1-x}O$), ferroelectric films, piezoelectric films, magnetic films, nitride films, carbide films, metal films (such as $PbZr_xTi_{1-x}O$, $SrBr_xTa_yO_z$), superconducting films and the like.

BRIEF DESCRIPTION OF THE DRAWINGS

For a better understanding of the invention, reference is made to the following drawings which are to be taken in conjunction with the detailed description to follow in which.

DESCRIPTION OF THE PREFERRED EMBODIMENTS

Figure 1:
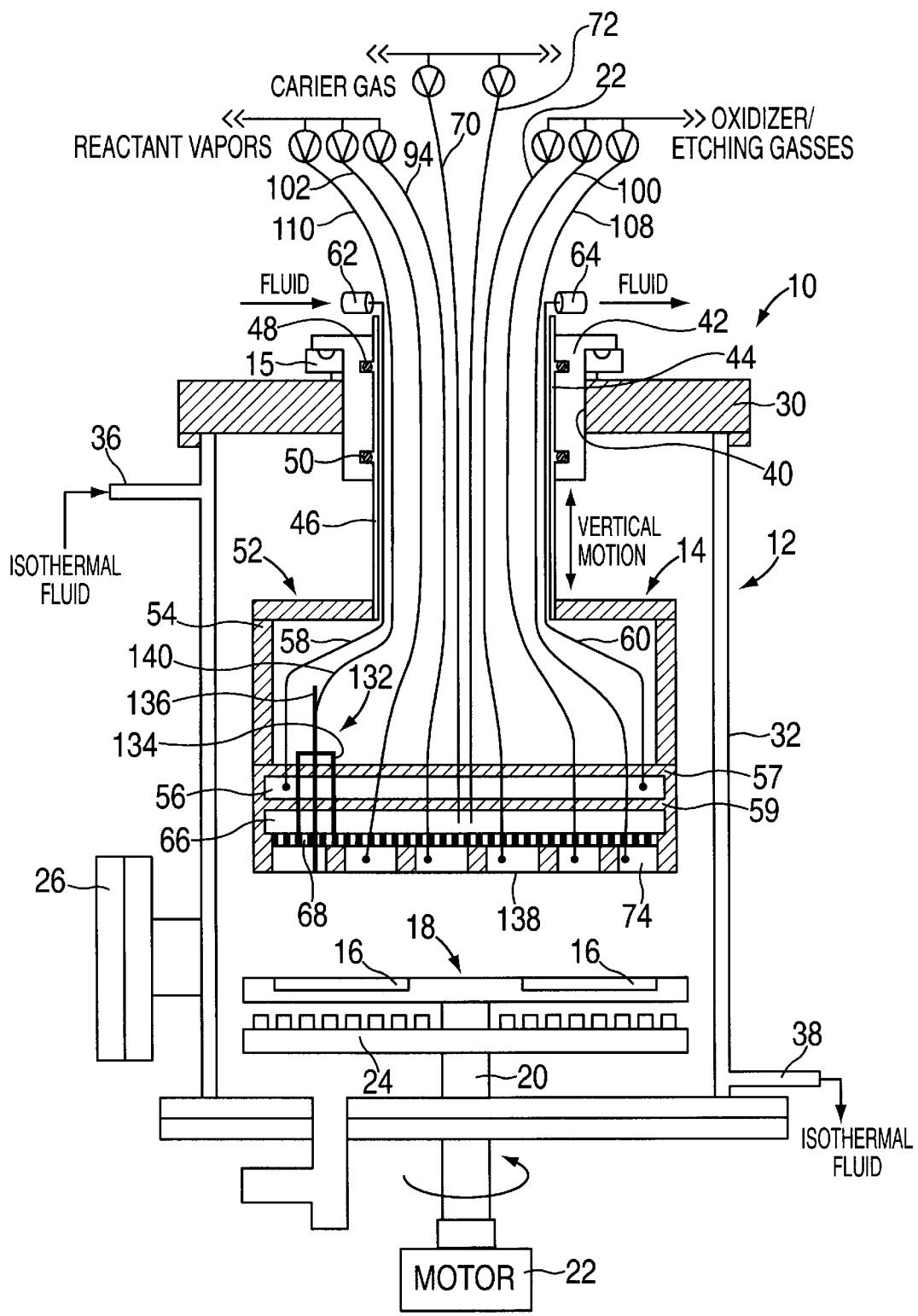
FIG. 1 is a sectional view of a Metal Organic Chemical Vapor Deposition (MOCVD) system constructed in accordance with the present invention.

FIG. 1 of the drawings illustrate a Metal Organic Chemical Vapor Deposition (MOCVD) System 10, which in general overview includes a reactor chamber 12, sealed to the atmosphere, in which is mounted a distribution housing (showerhead) 14 for the reactant gases. Distribution housing 14 directs the reactant gases over one or more substrate wafers 16, mounted on a rotatable susceptor 18 which is rotated through a shaft 20 by a motor 22 mounted externally from reactor chamber 12, and which are heated by a heater unit 24. For certain processes heater unit 24 can be replaced by a cooler unit. The reactant and carrier gases generated by external sources (not shown) are distributed though distribution housing 14 and flow over heated wafers 16 where the gases will decompose and deposit their compounds, thereafter an exhaust unit 26 will remove the spent gases from reactor chamber 12.

Reactor chamber 12 includes an upper wall 30, a cylindrical side wall 32 and a lower wall 34. Preferably side wall 32 is a double wall so as to permit a flow of isothermal fluid through the double wall from an inlet 36 to an outlet 38. The isothermal fluid will fill the double side wall 32 to enable the interior of reactor chamber 12 to be thermally isolated from the surrounding atmosphere. Extending through an opening 40 in upper wall 30 of reactor chamber 12 is a flanged annular insulating liner 42 which has an opening 44 engaging the upper part 46 of distribution housing 14. A first 48 and a second 50 O-ring serve to seal upper part 46 of distribution housing 14 and permit it to be moved vertically to adjust its position with respect to wafers 16 on susceptor 18. A suitable material for reactor chamber 12 is stainless steel and for insulating liner 42 is polytetrafluoroethylene (Teflon) with O-rings 48,50 being constructed from a suitable resilient material such as Viton (R). With the use of conductive materials for reactor chamber 12 and an insulating liner 42, an electrical bias may be applied to the entire distribution housing 14 which can assist in the deposition process.

The upper part 46 of distribution housing 14 is cylindrical in configuration and is of a smaller diameter than the lower part 52 which is also cylindrical and of a diameter large enough to extend over wafer carrier 18. A series of pipes carrying the reactant gases, the carrier gas or gases and the temperature control fluid, are routed through upper portion 46 of distribution housing 14 to a manifold section 54 of lower part 52. Located beneath manifold section 54 of distribution housing 14 is a temperature control chamber 56 having an upper wall 57 and a lower wall 59. Temperature control chamber 56 is connected to an inlet pipe 58 and an outlet pipe 60 for carrying a temperature control fluid, such as water or oil to control the temperature of the reactant and carrier gases whose pipes are routed through temperature control chamber 56. Inlet pipe 58 extends to a fluid inlet 62 located externally from reactor chamber 12 and outlet pipe 60 leads to an external outlet 64 and thereafter to a temperature controlled circulation pump (not shown) for the temperature control fluid.

Lower wall 59 of temperature control chamber 56 forms the upper wall of a uniform flow chamber 66, for the carrier gas, whose lower wall 68 is formed by a gas permeable material such as a metal frit or a screen. Pipes 70 and 72, which are routed from an external source of carrier gas or gases through temperature control chamber 56 feed uniform flow chamber 66. The carrier gas will then diffuse through gas permeable lower wall 68 to provide a uniform flow of carrier gas across the entire diameter of distribution housing 14. The pipes carrying the reactant gases are routed through, but do not flow into, uniform flow chamber 66.

Figure 2:
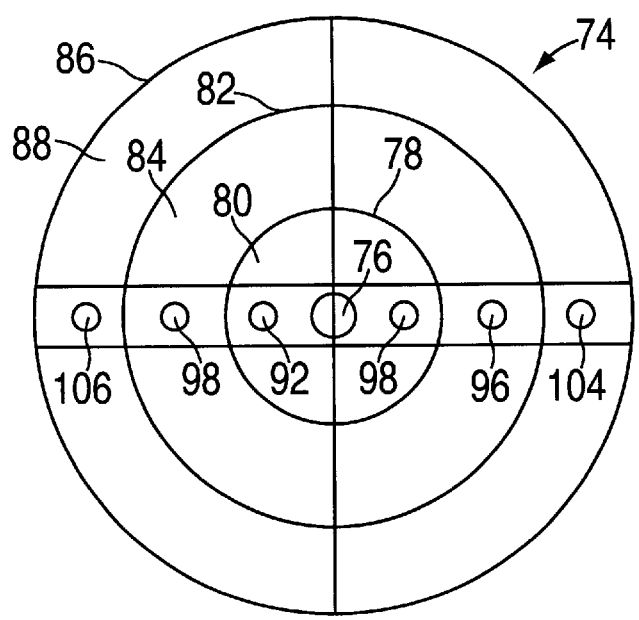
FIG. 2 is a plan view of the baffles of the reactant gas distribution chamber of the present invention.

Located beneath uniform flow chamber 66 is a reactant gas distribution chamber 74 one embodiment of which is illustrated in plan view in FIG. 2. The pipes carrying the reactant gases have their outlet in gas distribution chamber 74 which may include baffles which serve to preclude unwanted gas phase mixing of the reactant gases. FIG. 2 illustrates an arrangement of annular baffles forming separate annular chambers to isolate certain reactants from each other before deposition on substrate wafers 16. Gas distribution chamber 74 includes a central cylindrical baffle 76 and a second annular baffle 78 which form a first annular chamber 80 therebetween. A third annular baffle 82 forms a second annular chamber 84 with baffle 78. An outer annular baffle 86 forms a third annular chamber 88 with baffle 82. Outlets 90 and 92, located in chamber 80 are connected to reactant gas pipes 92 and 94 respectively. Outlets 96 and 98, located in chamber 84 are connected to reactant gas pipes 100 and 102 respectively. Outlets 104 and 106, located in outer chamber 88 are connected to reactant gas pipes 108 and 110 respectively.

Figure 3:
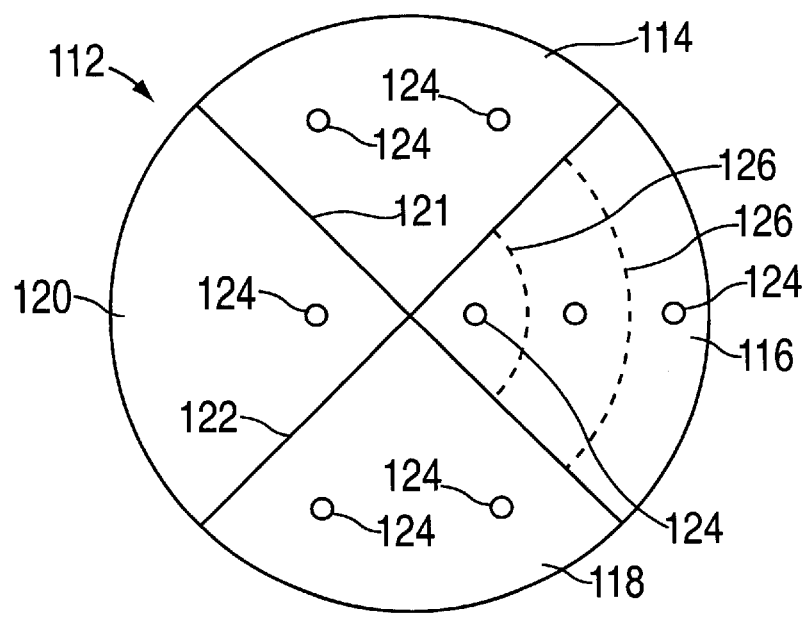
FIG. 3 is a plan view of alternative baffle configuration for the reactant gas distribution chamber of the present invention.

Chambers 80, 84 and 88 are effectively isolated from each other so that the reactant gases fed to the chambers will not intermingle, and possibly react, before being directed towards the deposition surface by the flow of carrier gas flowing from uniform flow chamber 66 through gas permeable wall 68, which forms the upper wall of chambers 80, 84 and 88. The present construction also permits the intermingling of certain reactants by simply feeding the gases to the same chamber by means of delivering the gases to the two outlets in the same chamber. The configuration of the baffles and chambers need not be annular as is illustrated in FIG. 3 which shows a gas distribution chamber 112 which has "wedge" shaped chambers 114,116, 118 and 120 formed by radial baffles 121,122. Each chamber may include one or more inlets 124 through which the reactant gases flow. Furthermore as is shown in chamber 120 the chamber may be further sub-divided by partial annular baffles 126. Suitable materials for the baffles are insulating materials as the baffles will also serve to position a plasma generating screen, described below. Preferably the baffles, of whatever configuration, are releaseably attachable to lower wall 68 of uniform flow chamber 66 so that they may be rearranged depending on the particular deposition regime to be undertaken. The baffles can also be removed and nozzles fitted to the outlets for the gases.

The present MOCVD system can readily provide plasma enhancement of the deposition process by means of a plasma generating system disposed integrally with distribution housing 14. A through opening 130 is located in walls 57,59 of temperature control chamber 56 and gas permeable wall 68 of uniform flow chamber 66 to permit the insertion of plasma unit 132 which includes an insulated tubular sleeve 134 which is sealed to opening 130. Disposed within insulating sleeve is a central conductive electrode 136 which extends out of the bottom and top ends of sleeve 136 the lower end of electrode 136 is electrically connected to a conductive gas permeable screen 138 (in the form of a porous mesh, frit or perforated plate) which extends over gas distribution chamber 74 and is mechanically supported by insulated baffles 76, 78, 82, and 86. The upper end of electrode 136 is connected to a suitable electrical cable 140 which is routed through manifold section 54 and upper part 46 of distribution housing 14 to an external source of RF energy 142 which is also electrically connected to wafer carrier 18 so as to strike a plasma between screen 138 and the deposition surface of wafers 16 and wafer carrier 18.

Figure 4:
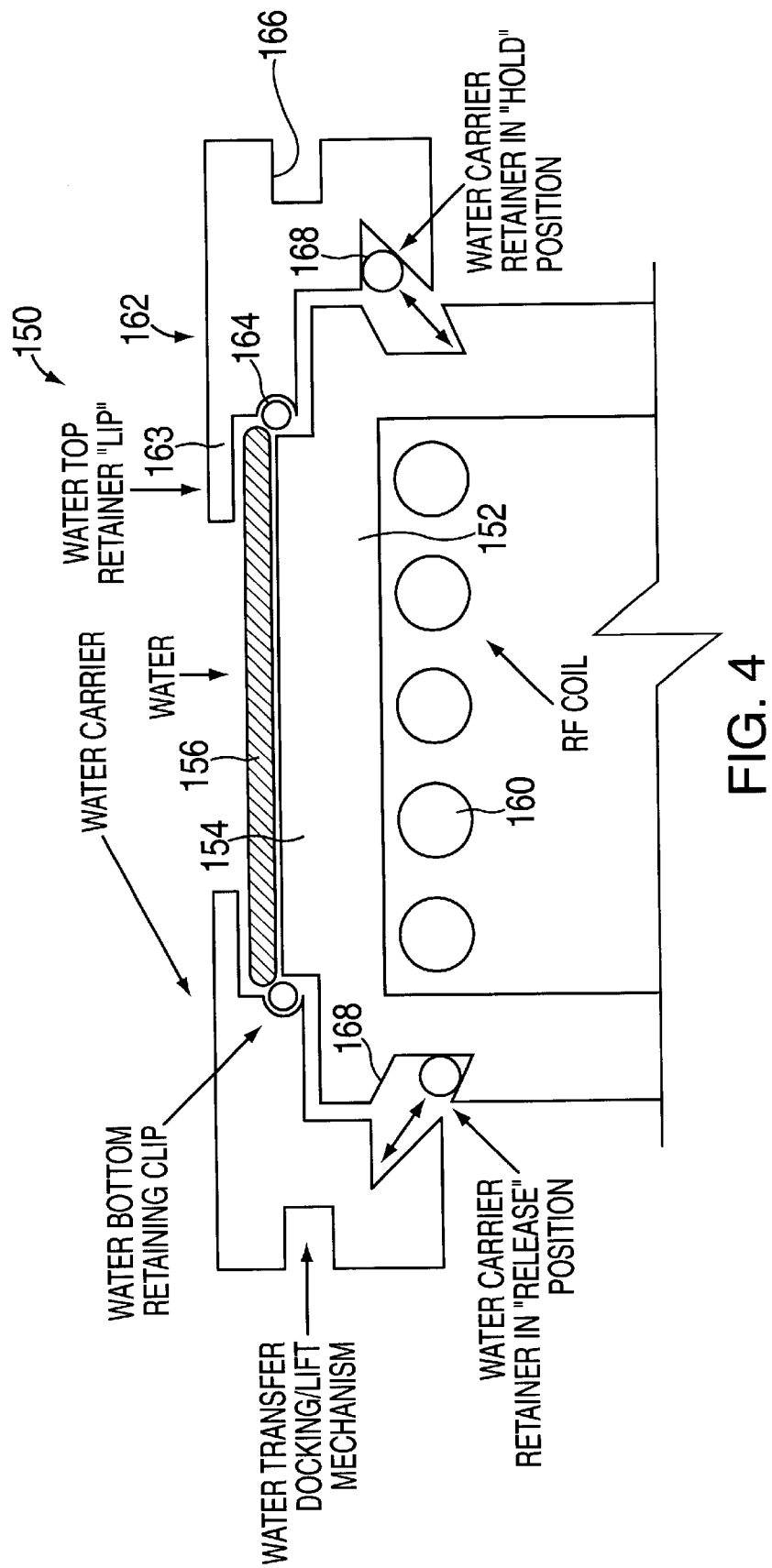
FIG. 4 is a sectional view of a non-levitating wafer carrier assembly for use with the present invention.

FIG. 4 illustrates a non-levitating wafer mounting system 150 for use in the present system, which includes a heat coupling susceptor 152 having an upper portion 154 which is in contact with a substrate wafer 156 or wafers. The lower portion of susceptor 152 is tubular in configuration and is rotated by motor 22 through driveshaft 20 (shown in FIG. 1). A temperature control unit 160 is located within susceptor 152 in proximity to upper portion 154 so that its heat or cooling will be transferred to wafer 156 through susceptor 152. Temperature control unit 160 can be in the form of cooling tubes which circulate chilled fluids to cool the wafers 156 for deposition processes, such as the parylene process described above. Temperature control unit 160 can also be a resistive or RF heating unit to heat wafers 156. However at the RF powers necessary for high temperature heating, eddy currents caused to flow in wafer 156 may cause it to "levitate" away from susceptor 152. In order to prevent levitation of wafer or wafers 156 wafer carrier 162 is releaseably attachable to susceptor 152. Wafer carrier 162 is annular in configuration and includes an inwardly extending lip 163 which engages the upper edge of wafer or wafers 156 and a retaining clip 164 which engages the lower edge of wafer 156. A notch 166 at the periphery of wafer carrier 162 may be engaged by a forked transfer arm (not shown) to lift and move wafer carrier 162 into and out of reactor chamber 12.

Wafer carrier 162 is locked into place on susceptor 152 during rotation by means of a centrifugally operable latching mechanism. One embodiment of such a latching mechanism are retaining balls 166 which ride in an angled groove 168 in susceptor 152. When susceptor 152 is rotating, balls 166 will move up groove 168 to engage a detent 170 in wafer carrier 162 (as shown at the right side of FIG. 4) thus locking wafer carrier 162 to susceptor 152 to prevent levitation of wafers 156 and wafer carrier 162. When susceptor 152 is not rotating (as shown at the left side of FIG. 4) balls 166 will move down groove 168 out of engagement with detent 170 and will permit wafer carrier 162 to be removed from susceptor 152. Instead of retaining balls 166 the retaining mechanism could also be in the form of a cylinder or other geometry, including a movable counter weighted "claw."

The pivotal piece could also be mounted on the wafer carrier. The main point is that when rotating, a retaining member engages and when rotation ceases, the retaining member retracts. A preferable material for the wafer carrier and the susceptor is graphite, other suitable materials or combination of materials are W, Mo, Pt, Haynes or Hastalloys, Al, Stainless Steel, SiC, Inconel and other refractory materials depending upon the process chemistry.

The gas distribution portion of the assembly operates by providing a uniform flow of carrier gas into which a distributed flow of reactant and carrier gas is injected. The combined gases then flow to the deposition surface where they thermally decompose and deposit the desired film. The high-speed rotation of the deposition surface generates a viscous drag, which acts as a pumping action, thereby mitigating the deleterious effects of thermal buoyancy on the flow and producing a streamlined flow. The plasma enhancement operates by striking a plasma between the showerhead and the deposition surface. However, in order to operate the plasma, deposition must generally occur at low, Torr, and sub-Torr pressures. The flow streamlines enhance manipulation of gas and plasma interactions. Lastly, to optimize performance, an automatic matching network can be utilized in RF operation.

The invention has been described with respect to preferred embodiments. However, as those skilled in the art will recognize, modifications and variations in the specific details which have been described and illustrated may be resorted to without departing from the spirit and scope of the invention as defined in the appended claims.

What is claimed is:

1. A system for effecting chemical vapor deposition upon a substrate of one or more reactant gases carried by at least one carrier gas comprising:

a) a reactor housing sealed against the atmosphere;

b) a gas distribution housing for receiving a plurality of pipes through which the reactant and carrier gases flow;

c) a temperature control chamber located within said distribution housing and coupled to an external source of temperature controlled fluid, said pipes carrying said reactant and carrier gases passing through said temperature control chamber so that the temperature of the gases flowing therethrough is affected by the temperature control fluid;

d) a diffusion chamber located within said distribution housing and connected to the carrier gas, said diffusion chamber having a gas permeable wall through which the carrier gas will flow so as to impart a uniform flow a the carrier gas over the area of the chamber;

e) a reactant distribution chamber located beneath the gas permeable wall of the diffusion chamber, said distribution chamber being connected to the pipes carrying the reactant gases, said distribution chamber being subdivided by means of baffle means, said baffle means precluding mixing of said selected ones of the reactant gases within said reactant distribution chamber;

f) a conductive porous mesh located beneath said distribution chamber;

g) an electrode located within said distribution housing and being electrically connected to said conductive porous mesh and a source of RF for generating a plasma from one or more of the reactant gases;

h) a substrate carrier for mounting said substrate in proximity to the gas distribution housing; and i) a temperature control unit for heating or cooling the substrate carried by the substrate carrier.

2. The chemical vapor deposition system as claimed in claim 1, wherein the substrate carrier includes a unit for rotating the substrate during deposition.

3. The chemical vapor deposition system as claimed in claim 2, wherein the temperature control unit comprises an RF heating unit.

4. The chemical vapor deposition system as claimed in claim 3, wherein the substrate carrier includes a latching device to prevent levitation of the substrate when subject to RF heating.

5. The chemical vapor deposition system as claimed in claim 4, wherein the latching device for preventing levitation of the substrate when subject to RF heating comprises a centrifugally operated clamp which is activated when the substrate carrier is rotating and which is deactivated when the substrate carrier is not rotating.

6. The chemical vapor deposition system as claimed in claim 2, wherein the temperature control unit comprises means for circulating cooled fluids.

7. The chemical vapor deposition system as claimed in claim 1, wherein the reactor housing is constructed with a double wall and includes a fluid circulation unit for circulating temperature control fluid within said double walls.

8. The chemical vapor deposition system as claimed in claim 1, wherein the distance between the substrate carrier and the gas distribution housing is adjustable.

9. The chemical vapor deposition system as claimed in claim 1, wherein the reactor housing includes a cylindrical side wall and an upper wall having an aperture therein, a generally annular insulating sleeve disposed in said aperture of said upper wall, a portion of said distribution housing extending through said annular sleeve, and seals disposed between said insulating sleeve and said portion of said distribution housing extending through said annular sleeve.

10. The chemical vapor deposition system as claimed in claim 9, wherein the seals comprise resilient O-rings.

11. A distribution unit for at least first and second reactant gases and at least one carrier gas in a CVD system comprising:

a) a distribution housing for receiving a plurality of pipes through which the reactant and carrier gases flow;

b) a temperature control chamber located within said distribution housing and coupled to an external source of temperature controlled fluid, said pipes carrying said reactant and carrier gases passing through said temperature control chamber so that the temperature of the gases flowing therethrough is affected by the temperature control fluid;

c) a diffusion chamber located within said distribution housing and connected to s source of carrier gas, said diffusion chamber having a gas permeable wall through which the carrier gas will flow so as to impart a uniform flow of the carrier gas;

d) a reactant distribution chamber located beneath the gas permeable wall of the diffusion chamber, said distribution chamber being connected to the pipes carrying the reactant gases, e) a conductive porous mesh located beneath said distribution chamber;

f) an electrode located within said distribution housing and being electrically connected to said conductive porous mesh and a source of RF for generating a plasma from one or more of the reactant gases.

12. The distribution unit as claimed in claim 11 wherein said reactant gas distribution chamber includes at least one baffle, said baffle sub-dividing said reactant distribution chamber to preclude mixing of said first and second reactant gases therewithin.

13. The distribution unit as claimed in claim 12 wherein said at least one baffle comprises at least two concentric circular walls.

14. The distribution unit as claimed in claim 12 wherein said at least one baffle comprises at least two walls extending radially outwardly.

15. The distribution unit as claimed in claim 11 further including a manifold section through which said pipes are routed.

16. The distribution unit as claimed in claim 11 wherein the distribution housing is cylindrical and includes an upper portion and a lower portion, the lower portion being of a smaller diameter than the upper portion containing said chambers.

* * * * *